United States Patent
Miyake et al.

(10) Patent No.: US 9,520,858 B2
(45) Date of Patent: Dec. 13, 2016

(54) COMMUNICATION DEVICE

(71) Applicant: Murata Manufacturing Co., Ltd., Nagaokakyo-shi, Kyoto-fu (JP)

(72) Inventors: Takashi Miyake, Nagaokakyo (JP); Koji Nosaka, Nagaokakyo (JP); Ryo Nakagawa, Nagaokakyo (JP); Haruki Kyouya, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 225 days.

(21) Appl. No.: 14/475,724

(22) Filed: Sep. 3, 2014

(65) Prior Publication Data

US 2014/0368401 A1 Dec. 18, 2014

Related U.S. Application Data

(63) Continuation of application No. PCT/JP2013/052693, filed on Feb. 6, 2013.

(30) Foreign Application Priority Data

Apr. 4, 2012 (JP) .................... 2012-085578

(51) Int. Cl.
*H03H 9/72* (2006.01)
*H03H 9/00* (2006.01)
(Continued)

(52) U.S. Cl.
CPC ........... *H03H 9/725* (2013.01); *H03H 9/0038* (2013.01); *H03H 9/542* (2013.01); *H03H 9/703* (2013.01);
(Continued)

(58) Field of Classification Search
CPC .... H01Q 1/50; H03H 9/0038; H03H 9/14576; H03H 9/542; H03H 9/703; H03H 9/706; H03H 9/72; H03H 9/725; H04B 1/50; H04B 1/525; H04L 5/14
(Continued)

(56) References Cited

U.S. PATENT DOCUMENTS 7,583,936 B2 * 9/2009 Kovacs .................... H04B 1/18
  333/133
8,923,167 B2 * 12/2014 Black .................... H04B 1/109
  370/277
(Continued)

FOREIGN PATENT DOCUMENTS

CN  1630980 A   6/2005
CN  101777932 A  7/2010
(Continued)

OTHER PUBLICATIONS

Official Communication issued in International Patent Application No. PCT/JP2013/052693, mailed on May 14, 2013.
(Continued)

*Primary Examiner* — Robert Pascal
*Assistant Examiner* — Jorge Salazar, Jr.
(74) *Attorney, Agent, or Firm* — Keating & Bennett, LLP

(57) ABSTRACT

A communication device is provided with a band elimination filter that has one end connected to an antenna terminal, and a first multiplexer that is connected to the other end of the band elimination filter. The band elimination filter is configured to eliminate signals of a frequency band that is different from the frequencies of signals transmitted and received in the first multiplexer, and is configured from a filter circuit that includes a bulk wave element.

16 Claims, 3 Drawing Sheets

(51) Int. Cl.
  *H03H 9/54* (2006.01)
  *H03H 9/70* (2006.01)
  *H04L 5/14* (2006.01)
  *H04B 1/50* (2006.01)
  *H04B 1/525* (2015.01)
  *H03H 9/145* (2006.01)
  *H01Q 1/50* (2006.01)

(52) U.S. Cl.
  CPC .............. *H03H 9/706* (2013.01); *H03H 9/72* (2013.01); *H04L 5/14* (2013.01); *H01Q 1/50* (2013.01); *H03H 9/14576* (2013.01); *H04B 1/50* (2013.01); *H04B 1/525* (2013.01)

(58) Field of Classification Search
  USPC ........... 333/133, 187, 188, 193, 194; 455/83
  See application file for complete search history.

(56) References Cited

U.S. PATENT DOCUMENTS

| | | |
|---|---|---|
| 2003/0160664 A1 | 8/2003 | Beaudin et al. |
| 2006/0192632 A1 | 8/2006 | Nakai et al. |
| 2007/0279149 A1* | 12/2007 | Dal Molin ......... A61N 1/37223 333/133 |
| 2008/0068109 A1* | 3/2008 | Schmidhammer ....... H04B 1/50 333/133 |
| 2010/0188166 A1 | 7/2010 | Hara et al. |
| 2012/0263077 A1 | 10/2012 | Xu et al. |

FOREIGN PATENT DOCUMENTS

| | | |
|---|---|---|
| JP | 2004-266361 A | 9/2004 |
| JP | 2010-062895 A | 3/2010 |
| JP | 2010-177770 A | 8/2010 |
| KR | 10-2004-0077950 A | 9/2004 |
| KR | 10-2011-0047303 A | 5/2011 |

OTHER PUBLICATIONS

Ueda et al., "Investigation on Nonlinear Distortion of Acoustic Devices for Radio-Frequency Applications and Its Supression," IEEE International Ultrasonics Symposium Proceedings, 2009, pp. 876-879.

Official Communication issued in corresponding Korean Patent Application No. 10-2014-7027600, mailed on Jul. 8, 2015.

* cited by examiner

COMMUNICATION DEVICE

BACKGROUND OF THE INVENTION

1. Field of the Invention

The present invention relates to a communication device that is configured to perform transmission and reception in a plurality of frequency bands, and particularly relates to a communication device including a duplexer.

2. Description of the Related Art

To date, a variety of communication devices that use a plurality of frequency bands have been proposed. For example, Japanese Unexamined Patent Application Publication No. 2004-266361 discloses a communication device that can process a transmission signal and a reception signal of a first frequency band, a transmission signal and a reception signal of a second frequency band, and a transmission signal and a reception signal in a third frequency band. In this case, a duplexer that processes the transmission and reception signals of the first frequency band, a triplexer that processes the transmission and reception signals of the second frequency band, and a duplexer that processes the transmission and reception signals of the third frequency band are connected to an antenna terminal. The duplexers and triplexer are configured using a SAW filter in order to reduce size and increase selectivity. Furthermore, in the communication device, it is possible to perform transmission and reception at the same time in the first to third frequency bands.

In the communication device described in Japanese Unexamined Patent Application Publication No. 2004-266361, if transmission was performed at the same time with a transmission signal of the second frequency band, noise was liable to occur in the first frequency band and the second frequency band. This is because, if a transmission signal of the first frequency band enters the triplexer that handles transmission and reception in the second frequency band, the first transmission signal and the second transmission signal cause intermodulation.

In other words, with a conventional communication device that handles signals of a plurality of frequency bands, if a plurality of transmission signals are transmitted at the same time, a transmission signal transmitted by a duplexer or a triplexer may enter another duplexer or triplexer, and the plurality of transmission signals may cause intermodulation.

It should be noted that a configuration is known in which a band elimination filter that uses a surface acoustic wave element is connected between an antenna terminal and a multiplexer in order to suppress noise due to the intermodulation distortion. In other words, noise caused by intermodulation distortion is suppressed by using a surface acoustic wave element and connecting a band elimination filter that eliminates signals of the frequency bands processed by other multiplexers. However, even in this kind of configuration, it should be noted that noise caused by intermodulation distortion due to the plurality of transmission signals is still liable to remain.

SUMMARY OF THE INVENTION

Preferred embodiments of the present invention provide a communication device that effectively reduces or prevents noise due to intermodulation distortion even when transmissions are performed at the same time in a plurality of frequency bands.

A communication device according to a preferred embodiment of the present invention includes an antenna terminal connected to an antenna, and is configured to perform transmission and reception at the same time in a plurality of frequency bands. The communication device according to a preferred embodiment of the present invention is provided with a band elimination filter that has one end connected to the antenna terminal, and a first multiplexer that is connected to the other end of the band elimination filter. The band elimination filter eliminates signals of a frequency band that is different from the frequency of the signals transmitted and received in the first multiplexer. This band elimination filter is defined by a filter circuit that includes a bulk wave element.

The first multiplexer preferably includes a filter circuit that includes an elastic wave element.

The band elimination filter preferably includes a ladder circuit.

Furthermore, at least one second multiplexer configured to transmit and receive signals of a frequency band that is different from that of the first multiplexer is preferably connected to the antenna terminal.

The stop frequency band of the band elimination filter preferably includes at least a portion of the transmission band of the second multiplexer.

The transmission band of the second multiplexer is preferably included within the stop frequency band of the band elimination filter.

A band elimination filter is preferably defined by a filter circuit that includes a bulk wave element. Due to the band elimination filter, signals of a frequency band that is different from the frequency band of the signals transmitted and received in the first multiplexer are eliminated. Therefore, even when transmission and reception are performed at the same time in a plurality of frequency bands, transmission signals and reception signals in other frequency bands are less liable to intrude into the first multiplexer. Consequently, it is possible to effectively reduce or prevent intermodulation between transmission and reception signals processed by the first multiplexer and transmission and reception signals in other frequency bands.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, specific preferred embodiments of the present invention are described with reference to the drawings to clarify the present invention.

Figure 1:
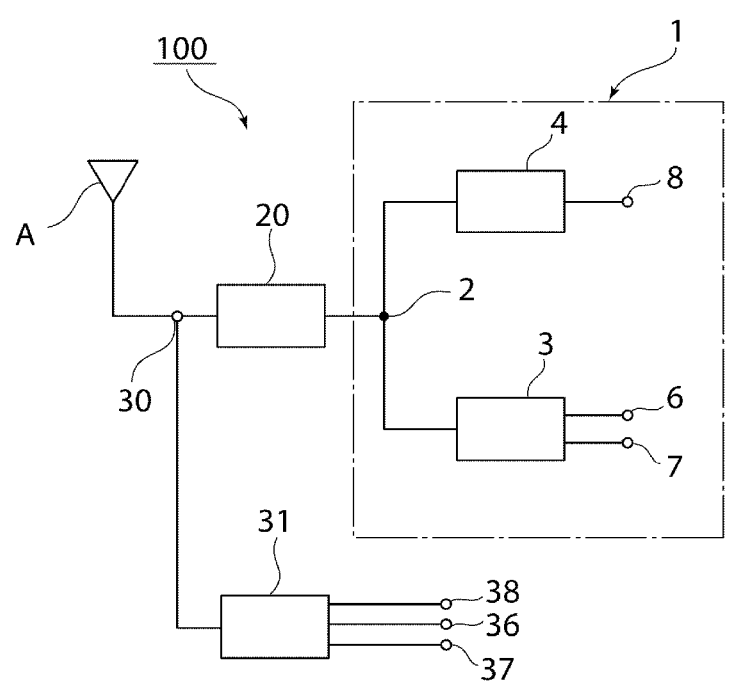
FIG. 1 is a schematic block diagram of a communication device according to a preferred embodiment of the present invention.

FIG. 1 is a schematic block diagram of a communication device according to a preferred embodiment of the present invention.

A communication device 100 includes an antenna terminal 30 that is connected to an antenna A. A duplexer 1 configured to perform transmission and reception in a first frequency band is connected to the antenna terminal 30. Furthermore, a second duplexer 31 configured to perform transmission and reception in a second frequency band is connected to the antenna terminal 30. In the present preferred embodiment, the first duplexer 1 and the second duplexer 31 preferably are used as first and second multiplexers. Another multiplexer such as a triplexer may also be used.

The first frequency band and the second frequency band are located in different frequency bands. A band elimination filter 20 is connected between the antenna terminal 30 and the first duplexer 1. In other words, one end of the band elimination filter 20 is connected to the antenna terminal 30, and the other end is connected to the duplexer 1. The first duplexer 1 includes a first transmission filter 4 and a first reception filter 3. The first transmission filter 4 is connected to a first transmission terminal 8. The first reception filter 3 is connected to first and second reception terminals 6 and 7.

The duplexer 31 preferably is configured in the same manner as the first duplexer 1. However, the duplexer 31 is configured so as to be able to transmit and receive signals of the second frequency band that is different from the first frequency band. The second duplexer 31 includes a second transmission terminal 38 and third and fourth reception terminals 36 and 37.

A signal that is output from the first transmission terminal 8 via the transmission filter 4 to the antenna terminal 30 is a first transmission signal. Furthermore, a signal that is retrieved from the first and second reception terminals 6 and 7 is a first reception signal. A signal that is input from the second transmission terminal 38 of the duplexer 31 and provided to the antenna terminal 30 from the second duplexer 31 is a second transmission signal. A signal retrieved from the third and fourth reception terminals 36 and 37 of the duplexer 31 is a second reception signal.

A system including the communication device 100 is configured so that it is possible for signals of the first frequency band and signals of the second frequency band to be transmitted and received at the same time.

The band elimination filter 20 is a band elimination filter that is able to eliminate signals of the second frequency band. The band elimination filter 20 of the present preferred embodiment preferably includes a filter circuit that includes a bulk wave element 21.

Figure 2A:
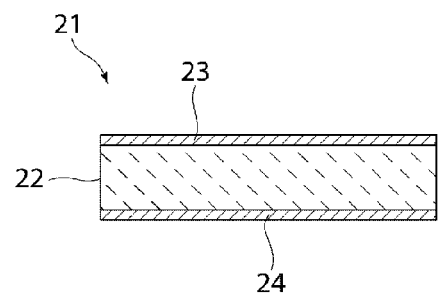
FIG. 2A is a front cross-sectional view depicting a bulk wave element included in a band elimination filter in a preferred embodiment of the present invention.

FIG. 2A is a front cross-sectional view depicting a bulk wave resonator that serves as the bulk wave element 21 used in the band elimination filter 20. The bulk wave element 21 includes a piezoelectric layer 22. The piezoelectric layer 22 includes piezoelectric ceramics subjected to poling treatment in the thickness direction. Excitation electrodes 23 and 24 are provided on both surfaces of the piezoelectric layer 22. The band elimination filter 20 is configured by connecting a plurality of these kinds of bulk wave elements 21 as depicted in FIG. 2B.

Figure 2B:
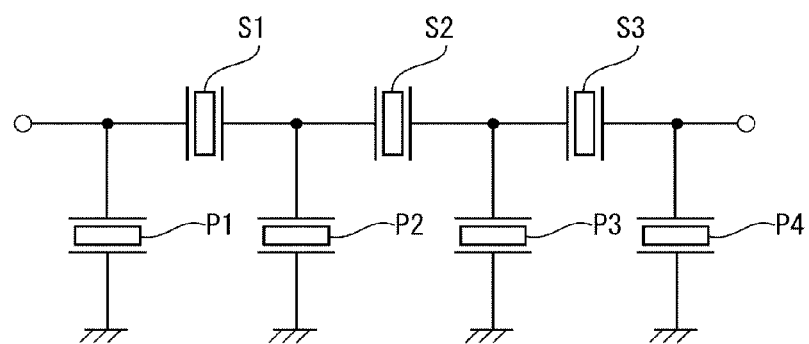
FIG. 2B is a circuit diagram of the band elimination filter.

As depicted in FIG. 2B, in the band elimination filter 20, a plurality of serial arm resonators S1 to S3 and a plurality of parallel arm resonators P1 to P4 are configured from bulk wave resonators that are the same as the bulk wave element 21. In other words, the band elimination filter 20 has a ladder-type circuit configuration. The circuit that defines the band elimination filter 20 is not restricted to this configuration. A band elimination filter having a circuit configuration such as one in which some of the serial arm resonators S1 to S3 and the parallel arm resonators P1 to P4 are replaced with an inductor may be used.

Figure 3:
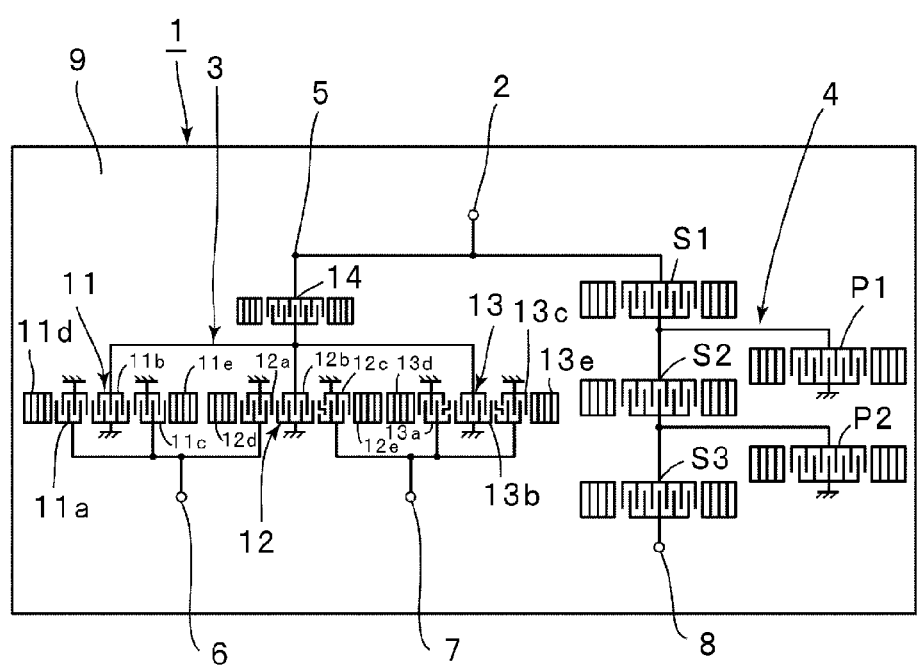
FIG. 3 is a circuit diagram of a duplexer included in a preferred embodiment of the present invention.

Next, the circuit configuration of the first duplexer 1 is described with reference to FIG. 3. The first duplexer 1 includes a terminal 2 that is connected to the band elimination filter 20. The terminal 2 is connected to the antenna terminal 30 via the band elimination filter 20.

The first reception filter 3 including a surface acoustic wave filter device, and the transmission filter 4 including a surface acoustic wave filter device having a ladder circuit configuration are connected to the terminal 2.

In the present preferred embodiment, the first reception filter 3 includes a balanced longitudinally coupled resonator-type surface acoustic wave filter. The first reception filter 3 includes first, second and third 3-IDT longitudinally coupled resonator-type surface acoustic wave filters 11 to 13. Input terminals of the first, second and third longitudinally coupled resonator-type surface acoustic wave filters 11 to 13 are connected in common, and are connected to an unbalanced signal terminal 5 via a 1-port-type surface acoustic wave resonator 14. The first, second and third longitudinally coupled resonator-type surface acoustic wave filters 11 to 13 include first, second and third IDTs 11a, 11b, 11c to 13a, 13b, 13c that are arranged in the propagation direction of surface acoustic waves. Furthermore, the first, second and third longitudinally coupled resonator-type surface acoustic wave filters 11 to 13 each include reflectors 11d, 11e, 12d, 12e, 13d, and 13e. In the transmission filter 4, the plurality of serial arm resonators S1 to S3 and the parallel arm resonators P1 and P2 are connected so as to define a ladder circuit. The serial arm resonators S1 to S3 and the parallel arm resonators P1 and P2 are each configured from a 1-port-type surface acoustic wave resonator.

The second duplexer 31 is also configured in the same manner as the first duplexer 1 except for the frequency bands being different. In other words, the transmission filter and the reception filter within the second duplexer 31 are configured from surface acoustic wave filters.

A feature of the present preferred embodiment lies in, as previously mentioned, the band elimination filter 20 being configured to include a plurality of bulk wave resonators including the bulk wave element 21. As previously mentioned, in conventional communication devices, there has been a problem in that noise intrudes into reception signals due to intermodulation distortion in the case where a first transmission signal and a second transmission signal are transmitted at the same time. In contrast to this, in the communication device 100 of the present preferred embodiment, because the band elimination filter 20 is provided, the second transmission signal is eliminated by the band elimination filter even when the first transmission signal and the second transmission signal are transmitted at the same time. Therefore, the second transmission signal is less liable to intrude into the first duplexer 1.

In addition, in the present preferred embodiment, because the band elimination filter 20 includes a filter circuit that uses a bulk wave element, it is possible for intermodulation distortion within the band elimination filter 20 to also be effectively reduced or prevented. This will be described in more detail.

If the band elimination filter is configured from a surface acoustic wave filter, intermodulation distortion in the first duplexer 1 can be suppressed. However, intermodulation distortion occurs within the band elimination filter. For example, an example is described in which the first frequency band is Band 5 and the second frequency band is Band 13. The Band 5 transmission signal frequency is Tx5, and the Band 13 transmission signal frequency is Tx13. In this case, the frequency of 2×Tx5−Tx13 is located in the Band 5 reception signal band. This third order intermodulation distortion is generated, and noise is generated in the Band 5 reception band. In other words, noise is generated in the first duplexer 1 due to the third order intermodulation distortion. This kind of intermodulation distortion can be suppressed if the band elimination filter 20, which has a stop band in the transmission frequency band of the second frequency band, is used.

However, if the band elimination filter 20 is configured using a surface acoustic wave filter, intermodulation distortion occurs within the surface acoustic wave filter. As is commonly known, in a filter that uses a bulk wave element, third order nonlinear distortion is low compared to a surface acoustic wave filter. Here, in the intermodulation distortion generated by the two signals of a signal having a frequency f1 and a signal having a frequency f2, distortion due to nonlinearity in which the generated frequency is n×f1±m×f2 (n and m being integers equal to or greater than 0) is $(n+m)^{th}$ order intermodulation distortion. Therefore, in the communication device 100 of the present preferred embodiment, the third order intermodulation distortion in which n=2 and m=1 in the band elimination filter 20 is effectively reduced or prevented. Thus, the generation of noise in the first reception signal is effectively reduced or prevented in the band elimination filter 20.

Consequently, according to the communication device 100 of the present preferred embodiment, it is possible for the communication quality of the first reception signal in the first frequency band to be effectively improved.

Next, specific experimental results are described.

A communication device 100 was made according to a preferred embodiment of the present invention, and, for comparison, a communication device was made having, as the band elimination filter 20, a band elimination filter that was the same except that a surface acoustic wave element was used instead of a bulk wave element.

To be specific, a band elimination filter that eliminates the Tx frequency band of Band 13 is positioned at the stage prior to a Band 5 duplexer. Tx band signals of Band 13 can be attenuated by this band elimination filter. Therefore, the energy with which Tx band signals of Band 13 enter the Band 5 DPX can be reduced. Thus, in the Band 5 duplexer, the amount of intermodulation distortion generated by Tx signals of Band 5 and Tx signals of Band 13 can be suppressed. Therefore, the stop band of the elimination filter is arranged within the Tx band of Band 13. More preferably, it is desirable for the entire Tx band of Band 13 to be included in the stop band of the band elimination filter.

The first frequency band was Band 5 and the second frequency band was Band 13. The input power of the first transmission signal, namely Tx5, was 25 dBm and 830 MHz in the communication devices of the preferred embodiments of the present invention and the comparative example. The input power of the second transmission signal, namely Tx13, was 15 dBm and 780 MHz. The first and second transmission signals were transmitted at the same time, and the first reception signal, namely the Band 5 reception signal, was measured at 880 MHz. As a result, the signal strength at 880 MHz was −115 dBm according to the preferred embodiment, in contrast with −90 dBm in the communication device of the comparative example. Therefore, compared to the comparative example, it is understood that intermodulation distortion is able to be effectively suppressed according to the present preferred embodiment of the present invention.

It should be noted that, in the aforementioned preferred embodiment of the present invention, although the second duplexer 31 is connected to the antenna terminal 30 as the second multiplexer, one or more multiplexers may be additionally connected.

Furthermore, in the aforementioned preferred embodiment of the present invention, a band elimination filter is not connected between the second duplexer 31 and the antenna terminal 30. However, it is desirable for a second band elimination filter to be connected also between the duplexer 31 that is the second multiplexer and the antenna terminal 30. This kind of second band elimination filter eliminates signals of the first frequency band, and is configured using a bulk wave element in the same manner as the band elimination filter 20. In this case, the intrusion of intermodulation distortion in the second duplexer 31 is also significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A communication device that is configured to perform transmission and reception at the same time in a plurality of frequency bands, the communication device comprising:
   an antenna terminal connected to an antenna;
   a band elimination filter including a first end connected to the antenna terminal and second end; and
   a first multiplexer connected to the second end of the band elimination filter; wherein
   the band elimination filter is configured to eliminate signals of a frequency band that is different from a frequency of signals transmitted and received in the first multiplexer, and the band elimination filter is configured from a filter circuit that includes a bulk wave element; and
   the first multiplexer includes a filter circuit that includes an elastic wave element.

2. The communication device according to claim 1, wherein the band elimination filter includes a plurality of serial arm resonators and a plurality of parallel arm resonators.

3. The communication device according to claim 2, wherein the serial arm resonators and the parallel arm resonators are each configured from a bulk acoustic wave resonator.

4. The communication device according to claim 1, wherein the band elimination filter includes a ladder circuit.

5. The communication device according to claim 1, further comprising a second multiplexer that is connected to the antenna terminal and is configured to transmit and receive signals of a frequency band that is different from that of the first multiplexer.

6. The communication device according to claim 5, wherein a stop frequency band of the band elimination filter includes at least a portion of a transmission band of the second multiplexer.

7. The communication device according to claim 6, wherein the transmission band of the second multiplexer is included within the stop frequency band of the band elimination filter.

8. The communication device according to claim 1, wherein the first multiplexer includes a first transmission filter and a first reception filter.

9. The communication device according to claim 8, wherein the first transmission filter is connected to a first transmission terminal.

10. The communication device according to claim 8, wherein the first reception filter is connected to first and second reception terminals.

11. The communication device according to claim 8, wherein the first reception filter includes first, second and third 3-IDT longitudinally coupled resonator-type surface acoustic wave filters.

12. The communication device according to claim 11, wherein input terminals of the first, second and third longitudinally coupled resonator-type surface acoustic wave filters are connected in common, and are connected to an unbalanced signal terminal via a 1-port-type surface acoustic wave resonator.

13. The communication device according to claim 11, wherein the first, second and third longitudinally coupled resonator-type surface acoustic wave filters include first, second and third IDTs arranged in a propagation direction of surface acoustic waves and a plurality of reflectors.

14. The communication device according to claim 1, wherein the bulk wave element includes a bulk wave resonator.

15. The communication device according to claim 14, wherein the bulk wave element includes a piezoelectric layer and excitation electrodes provided on both surfaces of the piezoelectric layer.

16. A communication device that is configured to perform transmission and reception at the same time in a plurality of frequency bands, the communication device comprising:
    an antenna terminal connected to an antenna;
    a band elimination filter including a first end connected to the antenna terminal and second end; and
    a first multiplexer connected to the second end of the band elimination filter; wherein
    the band elimination filter is configured to eliminate signals of a frequency band that is different from a frequency of signal transmitted and received in the first multiplexer, and the band elimination filter is configured from a filter circuit that includes a bulk wave element;
    the first multiplexer includes a first transmission filter and a reception filter; and
    the first reception filter includes a balanced longitudinally coupled resonator-type surface acoustic wave filter.

* * * * *